United States Patent [19]

Tamura et al.

[11] Patent Number: 4,479,060
[45] Date of Patent: Oct. 23, 1984

[54] APPARATUS FOR IRRADIATION WITH CHARGED PARTICLE BEAMS

[75] Inventors: Hifumi Tamura, Hachioji; Tohru Ishitani, Sayama; Akira Shimase, Yokohama, all of Japan

[73] Assignee: Hitachi, Ltd., Tokyo, Japan

[21] Appl. No.: 454,027

[22] Filed: Dec. 28, 1982

[30] Foreign Application Priority Data

Jan. 22, 1982 [JP] Japan .............................. 57-6379[U]

[51] Int. Cl.[3] ...................... H01J 3/14; G01N 23/04; G01N 23/225
[52] U.S. Cl. .................................. 250/398; 250/310; 250/311
[58] Field of Search ..................... 250/398, 310, 311

[56] References Cited
U.S. PATENT DOCUMENTS 2,356,633  8/1944  Von Ardenne ..................... 250/311
3,617,739  11/1971  Liebl ............................... 250/310 X
4,233,509  11/1980  Tamura et al. ................. 250/310 X Primary Examiner—Alfred E. Smith
Assistant Examiner—Jack I. Berman
Attorney, Agent, or Firm—Antonelli, Terry & Wands

[57] ABSTRACT

An apparatus according to the present invention for irradiating a specimen with charged particle beams comprises a single charged particle generating source from which the charged particle beams formed of electrons and negative ions, respectively, can be simultaneously derived; a specimen holder on which the specimen is placed; and charged particle irradiation means which is interposed between the charged particle generating source and the specimen holder in order to focus the charged particle beams and to irradiate the surface of the specimen with the focused beams, and which includes at least one magnetic lens and at least one electrostatic lens that are individually disposed.

2 Claims, 4 Drawing Figures

APPARATUS FOR IRRADIATION WITH CHARGED PARTICLE BEAMS

BACKGROUND OF THE INVENTION

The present invention relates to improvements in an apparatus wherein charged particle beams, which are respectively formed of electrons and negative ions, are simultaneously derived from an identical source so as to irradiate the surface of a specimen therewith. More particularly, it relates to a lens system in the apparatus of this type.

The simultaneous irradiation of the surface of a specimen with an electron beam and a negative ion beam makes it possible to conduct the dynamic structural observation and elemental analysis of the specimen on the surface and in the depth direction thereof.

As a charged particle beam-irradiation apparatus which is used for such purpose, there is one disclosed in U.S. Pat. No. 3,617,739. This apparatus is so constructed that an ion source and an electron source are individually disposed, and that an ion beam and an electron beam are guided to an identical lens system by magnetic deflection means so as to irradiate the surface of a specimen therewith. The lens system in this apparatus is constructed of a hybrid lens in which a magnetic lens and an electrostatic lens are unitarily formed.

Another charged particle beam-irradiation apparatus for the same purpose is disclosed in European Patent Application Publication No. 0003659. This apparatus is so constructed that an electron beam and a negative ion beam are simultaneously derived from an identical source, and that the surface of a specimen is irradiated with the beams by an electrostatic lens.

The construction in which the ion source and the electron source are individually disposed, needs to guide the ion beam and the electron beam to the identical lens system by the use of the magnetic deflection means. With this construction, therefore, it is difficult to remove the deflection distortions of the respective beams. As a result, it becomes difficult to project the ion beam and the electron beam on an identical place. Moreover, since the hybrid lens uses parts of the electrodes of the magnetic lens and the electrostatic lens in common, the principal planes of both the lenses are substantially in agreement. As a result, in a case where such hybrid lens is used as an objective lens, the working distance between the electron beam and the ion beam cannot be varied largely.

In contrast, the construction in which the electron beam and the ion beam are simultaneously derived from the identical source is easy of projecting the respective beams on an idential place. Moreover, since the electrostatic lens is employed as the lens system of the apparatus, the electron beam and the ion beam having equal levels of energy undergo the same focusing actions. As regards the electrostatic lens, however, it is essentially difficult to fabricate a short focus lens. As a result, it is generally difficult to obtain an electron beam having a minute spot diameter.

SUMMARY OF THE INVENTION

It is accordingly an object of the present invention to provide an apparatus for irradiation with charged particle beams which can form an electron beam having a spot diameter finer than that of an ion beam.

In order to accomplish the object, an apparatus according to the present invention for irradiation with charged particle beams is characterized by comprising a single charged particle generating source from which the charged particle beams formed of electrons and negative ions, respectively, can be simultaneously derived; a specimen holder on which a specimen is put; and charged particle irradiation means which is interposed between said charged particle generating source and said specimen holder in order to focus the charged particle beams and to irradiate a surface of the specimen with the focused beams, and which includes at least one magnetic lens and at least one electrostatic lens that are individually disposed.

With such characterizing construction of the present invention, it becomes possible, owing to the great difference of mass numbers between the electron and the ion, that the ion beam is subjected to a focusing action by only the electrostatic lens, whereas the electron beam is subjected to focusing actions by both the magnetic lens and the electrostatic lens. As a result, the spot diameter of the electron beam on the surface of the specimen can be made much smaller than that of the ion beam.

DETAILED DESCRIPTION

Figure 1:
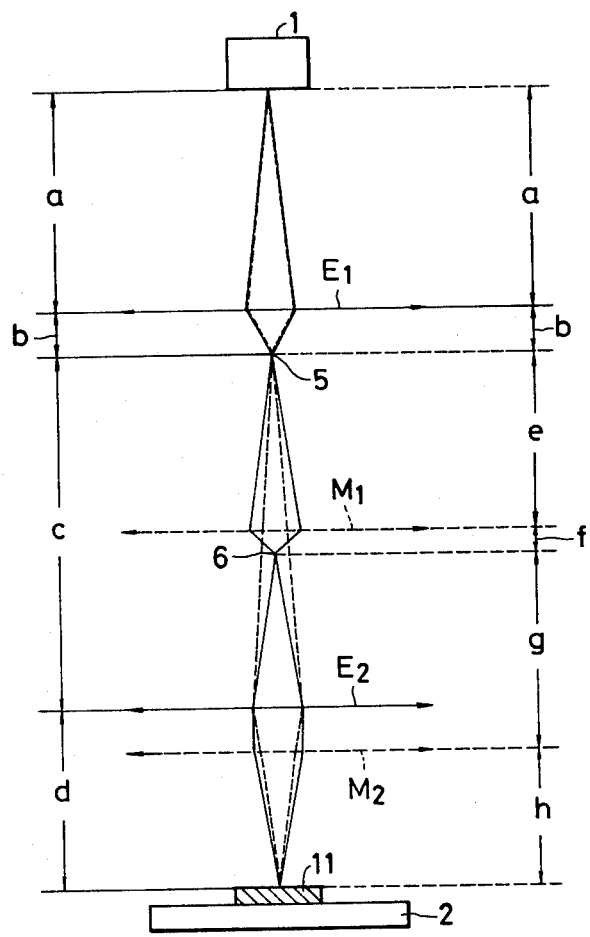
FIG. 1 is a principle arrangement diagram of an apparatus according to the present invention for irradiation with charged particle beams.

FIG. 1 shows the principle arrangement of a charged particle beam-irradiation apparatus according to the present invention. Referring to the figure, the apparatus is constructed of a single charged particle generating source 1 from which both charged particle beams formed of electrons and negative ions, respectively, can be simultaneously derived; a specimen holder 2 on which a specimen 11 is put; and charged particle irradiation means which is composed of electrostatic lenses $E_1$, $E_2$ and magnetic lenses $M_1$, $M_2$ and which is interposed between the charged particle generating source 1 and the specimen holder 2 in order to focus the charged particle beams and to irradiate the surface of the specimen 11 with the focused beams. Of the charged particle beams, the ion beam is indicated by broken lines, and the electron beam by solid lines. Letter a denotes the distance between the charged particle generating source 1 and the principal plane of the electrostatic lens $E_1$, letter b the distance between the principal plane of the electrostatic lens $E_1$ and a focused point 5, letter c the distance between the focused point 5 and the principal plane of the electrostatic lens $E_2$, and letter d the distance between the principal plane of the electrostatic lens $E_2$ and the specimen 11. Further, letter e denotes the distance between the focused point 5 and the principal plane of the magnetic lens $M_1$, letter f the distance between the principal plane of the magnetic lens $M_1$ and a focused point 6, letter g the distance between the focused point 6 and the principal plane of the magnetic lens $M_2$, and letter h the distance between the principal plane of the magnetic lens $M_2$ and the specimen 11.

In the lens system as described above, the demagnification factor $M_e$ of the electron beam indicated by the solid lines is approximately given by the following expression:

$$M_e = b/a \cdot f/e \cdot h/g \qquad (1)$$

In addition, the demagnification factor $M_i$ of the ion beam indicated by the broken lines is approximately given by the following expression:

$$M_i = b/a \cdot d/c \qquad (2)$$

In Expressions (1) and (2), $h/g \simeq d/c$ is held by physical restrictions. It turns out that, in the lens system, the demagnification factor $M_e$ of the electron beam is f/e times greater than the demagnification factor $M_i$ of the ion beam.

That is, in such lens system in which the magnetic lenses and the electrostatic lenses are individually arranged, owing to the great difference of mass numbers between the electron and the ion, the ion beam is subjected to focusing actions by only the electrostatic lenses $E_1$, $E_2$, whereas the electron beam is subjected to focusing actions by both the electrostatic lenses $E_1$, $E_2$ and the magnetic lenses $M_1$, $M_2$.

As a result, the demagnification factor $M_e$ of the electron beam can be made f/e times greater than that $M_i$ of the ion beam.

Moreover, in the foregoing lens system, the demagnification factor $M_e$ of the electron beam, in other words, the spot diameter of the electron beam on the surface of the specimen 11 can be changed substantially irrespective of the spot diamater of the ion beam, by changing the focal length of the magnetic lens $M_1$.

In forming the electron beam of a spot diameter smaller than that of the ion beam in this manner, the construction of the lens system described above is not restrictive, but the purpose is achieved by employing a lens system which is constructed of one magnetic lens and one electrostatic lens that are individually arranged.

Of course, a larger number of electrostatic lenses or magnetic lenses may be arranged in order to make the demagnification factor of the electron beam still greater than the value $M_e$ in the foregoing lens system.

When the function of the magnetic lens or lenses is stopped in such lens system, the electron beam and the ion beam depict quite the same trajectories, and besides, the spot diameters of both the beams can be made equal.

As thus far described, using the lens system constructed of at least one magnetic lens and at least one electrostatic lens which are individually arranged, the spot diameter of the electron beam can be made much smaller than that of the ion beam, both the beams having been derived from the identical source. Moreover, the spot diameter of the electron beam can be varied substantially independently of that of the ion beam. Further, both the beams can be held at equal spot diameters.

Now, there will be explained concrete analyzers to which the charged particle beam-irradiation apparatus according to the present invention is applied.

Figure 2:
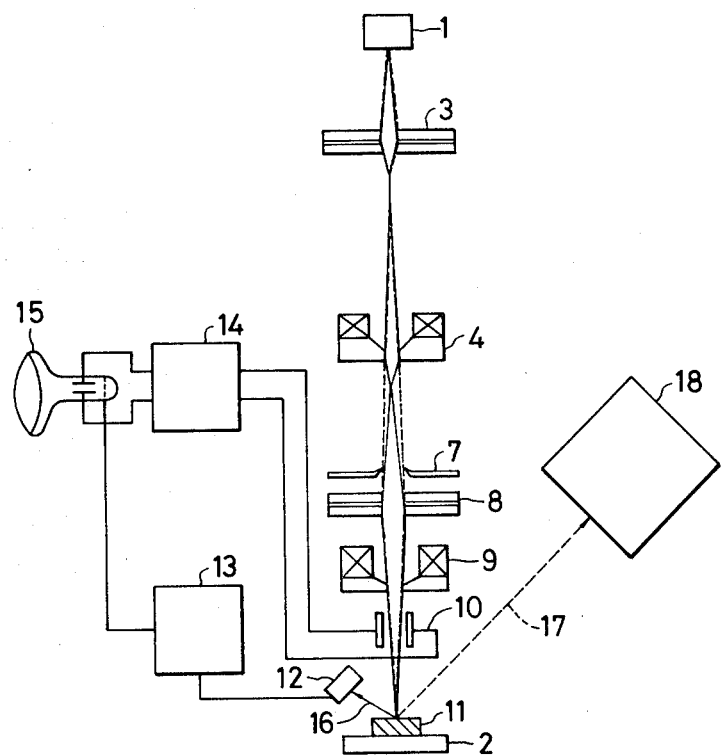
FIG. 2 is a fundamental arrangement diagram in the case where the present invention is applied to a complex analyzer which has a scanning electron microscope combined with a secondary ion mass spectrometer.

FIG. 2 shows the fundamental arrangement in the case where the present invention is applied to a complex analyzer which has a scanning electron microscope combined with a secondary ion mass spectrometer.

Referring to the figure, the complex analyzer is constructed of a charged particle generating source 1, e.g., duoplasmatron type ion source or liquid metal ion source, from which electrons and negative ions can be simultaneously derived; electrostatic lenses 3, 8; magnetic lenses 4, 9; an aperture 7; a deflector 10; a specimen holder 2 on which a specimen 11 is put; a mass spectrometer 18; a secondary charged particle detector 12; an amplifier 13; a scanning generator 14; and a cathode ray tube (CRT) 15. An ion beam is indicated by broken lines, and an electron beam by solid lines.

Such complex analyzer operates as stated below.

The ion beam derived from the charged particle generating source 1 is focused on the surface of the specimen 11 by the 2-lens system which is composed of the electrostatic lenses 3 and 8. Similarly, the electron beam derived from the charged particle generating source 1 is focused on the surface of the specimen 11 by the 4-lens system which is composed of the electrostatic lenses 3 and 8 and the magnetic lenses 4 and 9. Thus, the demagnification factor of the ion beam is 1-1/100 or so, and assuming that the ion beam is derived from the charged particle generating source 1 with a diameter of 100 μm, the spot diameter thereof on the specimen 11 falls within a range from 100 μm to 1 μm. On the other hand, the demagnification factor of the electron beam is below 1/10000, and assuming that the electron beam is derived from the charged particle generating source 1 with a diameter of 100 μm, the spot diameter thereof on the specimen 11 becomes below 100 Å.

Secondary ions 17 emitted from the surface of the specimen 11 by the irradiation with the ion beam are guided to the mass spectrometer 18, in which they are separated in accordance with their masses. On the other hand, secondary electrons 16 emitted from the surface of the specimen 11 by the irradiation with the electron beam are detected by the secondary charged particle detector 12 and amplified by the amplifier 13, whereupon they become the intensity modulation signal or video signal of the CRT 15. Since the charged particle beams consisting of the electron beam and the ion beam are caused to scan the surface of the specimen 11 by the deflector 10, secondary electron images corresponding to the points of the specimens 11 are observed on the screen of the CRT 15.

That is, with the complex analyzer described above, while a comparatively large area is being etched by the ion beam, the etched surface can be observed at high resolution and dynamically in the depth direction of the specimen by virtue of the electron micro-beam.

When the wing of a metallic wood boring beatle was mentioned as the specimen 11 and the distribution of elements and the structural variation of the tissue in the depth direction of the specimen were analyzed, the apparatus of the embodiment was proved to be effective. In this manner, the present embodiment has made it possible to conduct the observation of the variation of the internal structure of the tissue of a substance and the elemental analysis of the tissue at high sensitivity, in the same place and at the same time.

Figure 3:
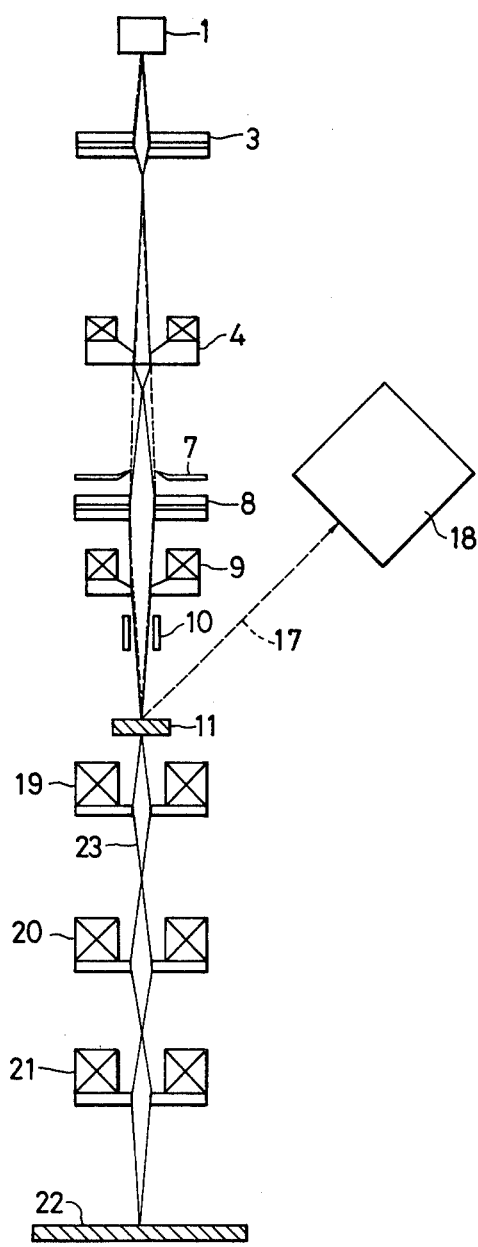
FIG. 3 is a fundamental arrangement diagram in the case where the present invention is applied to a complex analyzer which has a transmission electron microscope combined with a secondary ion mass spectrometer.

FIG. 3 shows the fundamental arrangement in the case where the present invention is applied to a complex analyzer which has a transmission electron microscope combined with a secondary ion mass spectrometer. Referring to the figure, the complex analyzer in constructed of a charged particle generating source 1; electrostatic lenses 3, 8; magnetic lenses 4, 9; an aperture 7;

a deflector 10; a specimen holder (not shown) on which a specimen 11 is put; a mass spectrometer 18; magnetic lenses 19, 20, 21 which focus back-scattered electrons 23; and a fluorescent screen 22. An ion beam is indicated by broken lines, and an electron beam by solid lines.

Such complex analyzer operates as stated below.

The specimen 11 to be analyzed is, for example, a human liver tissue. It is thinned, and is supported on the meshy specimen holder (not shown). This specimen 11 is irradiated with the negative ion beam focused by the electrostatic lenses 3, 8, and the electron micro-beam focused by the electrostatic lenses 3, 8 and the magnetic lenses 4, 9. Of the beams, the electron beam is back-scattered in the specimen 11. The back-scattered electron beam 23 is guided to the projection lens system consisting of the magnetic lenses 19, 20 and 21, while holding information on the specimen 11. Thereafter, the electron beam 23 is projected on the fluorescent screen 22 to form thereon a transmitted electron image of the specimen 11 at high resolution.

Figure 4:
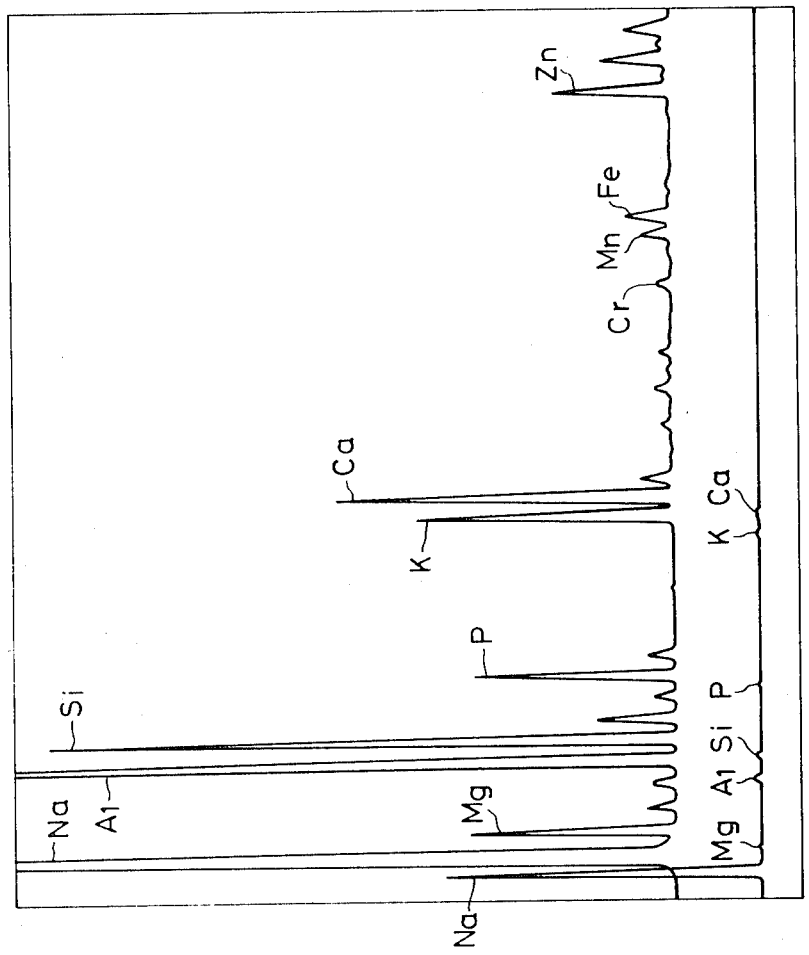
FIG. 4 is a secondary ion mass spectrum chart of a human liver tissue obtained by the use of the analyzer shown in FIG. 3.

On the other hand, secondary ions 17 emitted from the surface of the specimen 11 by the irradiation with the ion beam are guided to the mass spectrometer 18, in which they are separated in accordance with their masses. FIG. 4 shows the mass spectrum of the liver tissue obtained in this manner. As seen from this figure, very small amounts of metal components contained in the human liver tissue are measured at high sensitivity.

That is, with the complex analyzer described above, the distribution of elemental densities in the depth direction of the specimen 11 and the corresponding variation of the internal structure can be analyzed simultaneously and dynamically by utilizing the sputtering phenomenon based on the ion beam.

As set forth above, the present invention has permitted the provision of a charged particle beam-irradiation apparatus in which the spot diameter of an electron beam on the surface of a specimen can be made much smaller than that of an ion beam. By applying such charged particle beam-irradiation apparatus, it becomes very easy to realize a complex analyzer with which the elemental analysis of a specimen can be performed while the internal structure of the specimen is being dynamically observed from the surface thereof.

We claim:

1. An apparatus for irradiation with charged particle beams, comprising a single charged particle generating source from which the charged particle beams formed of electrons and negative ions, respectively, can be simultaneously derived; a specimen holder on which a specimen is put; and charged particle irradiation means which is interposed between said charged particle generating source and said specimen holder in order to focus the charged particle beams and to irradiate a surface of the specimen with the focused beams, and which includes at least one magnetic lens and at least one electrostatic lens that are individually disposed.

2. An apparatus for irradiation with charged particle beams as defined in claim 1, wherein said charged particle irradiation means is constructed of a lens system in which two electrostatic lenses and two magnetic lenses are alternately arranged.

* * * * *